(12) United States Patent
Memmen

(10) Patent No.: US 10,801,338 B1
(45) Date of Patent: Oct. 13, 2020

(54) APPARATUS AND PROCESS OF FORMING AN INTEGRALLY BLADED ROTOR WITH COOLED SINGLE CRYSTAL BLADES AND AN EQUIAX NICKEL DISK

(71) Applicant: Florida Turbine Technologies, Inc., Jupiter, FL (US)

(72) Inventor: Robert L Memmen, Stuart, FL (US)

(73) Assignee: Florida Turbine Technologies, Inc., Jupiter, FL (US)

( * ) Notice: Subject to any disclaimer, the term of this patent is extended or adjusted under 35 U.S.C. 154(b) by 40 days.

(21) Appl. No.: 16/038,252

(22) Filed: Jul. 18, 2018

(51) Int. Cl.
| F01D 5/30 | (2006.01) |
| B22F 5/00 | (2006.01) |
| F01D 5/34 | (2006.01) |
| F01D 5/18 | (2006.01) |

(52) U.S. Cl.
CPC ............. *F01D 5/34* (2013.01); *F01D 5/186* (2013.01); *F01D 5/30* (2013.01); *B22F 5/009* (2013.01); *F01D 5/303* (2013.01); *F05D 2230/211* (2013.01); *F05D 2230/23* (2013.01); *F05D 2230/42* (2013.01); *F05D 2240/24* (2013.01); *F05D 2300/131* (2013.01); *F05D 2300/1723* (2013.01)

(58) Field of Classification Search
CPC ...... B23P 15/006; F01D 5/303; F01D 5/3061; F01D 5/3038; F05D 2230/23; F05D 2230/30; F05D 2230/42; B22F 5/009
See application file for complete search history.

(56) References Cited

U.S. PATENT DOCUMENTS

| 4,581,300 | A | 4/1986 | Hoppin, III et al. |
| 4,813,470 | A | 3/1989 | Chiang |
| 5,061,154 | A | 10/1991 | Kington |
| 5,113,583 | A | 5/1992 | Jenkel et al. |
| 6,969,240 | B2 | 11/2005 | Strangman |
| 8,231,350 | B1* | 7/2012 | Liang ................ F01D 5/087 416/97 R |
| 8,262,817 | B2 | 9/2012 | Marshall et al. |
| 8,408,446 | B1 | 4/2013 | Smoke et al. |
| 2016/0130957 | A1* | 5/2016 | Freeman .............. F01D 5/3061 416/193 R |

* cited by examiner

*Primary Examiner* — Christopher J Besler
(74) *Attorney, Agent, or Firm* — Christopher & Weisberg, P.A.

(57) ABSTRACT

An air cooled integrally bladed rotor with single crystals turbine rotor blades having cooling air passages formed into an equiax rotor disk, where a mold having expendable Molybdenum tooling and reusable molybdenum tooling is used to form the IBR. An annular blade ring with openings is used to secure the single crystal rotor blades within the mold, and a number of tube tools are inserted into a bottom end of each blade that forms a cooling air supply passage within the rotor disk. Two molybdenum circular shaped hubs are used to secure a bottom end of the tube tools with the mold. The mold is filled with metal powder and high pressure is used to solidify the powder to form the IBR. Expendable tooling is removed using sublimation when exposed to oxygen. Reusable tooling is reused to form additional IBRs.

9 Claims, 8 Drawing Sheets

APPARATUS AND PROCESS OF FORMING AN INTEGRALLY BLADED ROTOR WITH COOLED SINGLE CRYSTAL BLADES AND AN EQUIAX NICKEL DISK

CROSS-REFERENCE TO RELATED APPLICATIONS

None.

GOVERNMENT LICENSE RIGHTS

None.

BACKGROUND OF THE INVENTION

Field of the Invention

The present invention relates generally to a gas turbine engine, and more specifically to an IBR with cooled single crystal rotor blades and an equiaxed nickel disk.

Description of the Related Art Including Information Disclosed Under 37 CFR 1.97 and 1.98

In a gas turbine engine, a compressor produces compressed air for a combustor that produces a hot gas flow that is passed through a gas turbine, where the gas turbine drives the compressor and a fan such as in an aero gas turbine engine. The gas turbine must withstand the highest temperatures within the engine. An efficiency of the engine can be increased using a higher gas flow temperature into the gas turbine.

A typical gas turbine includes a rotor with a number of turbine rotor blades attached. A rotor blade would have an attachment end such as a fir tree attachment or a dove tail attachment that slides within a slot formed on an outer surface of the rotor disk. The blade attachment and the disk slot must be machined to high precision in order to minimize a gap formed between the blades and the slots. For a larger engine, these gaps are relatively small and thus any leakage across the disk has a minimal effect. However, for a smaller engine such as one used for an unmanned aero vehicle or UAV, the relative size of a gap to the disk would be large and thus the leakage flow would be critical. For this reason, a gas turbine is typically formed as an integrally bladed rotor (IBR) in which the rotor blade 4s and the rotor disk are all formed as a single piece to eliminate any gaps. A typical IBR for a small gas turbine engine is cast using the investment casting process in which a ceramic core is used in a mold in which liquid metal is poured. Some machining of the IBR can even be used. One disadvantage of the single piece IBR is that the rotor blades and the rotor disk are made from the same material.

Single crystal rotor blades provide superior high temperature creep strength in a temperature range of 1,400 F and are considered preferred for turbine airfoil applications. However, attempts to use single crystal airfoils in integral turbine blades disks and nozzles have been hampered by inadequate grain boundary strength between adjacent single crystal airfoils, which necessitated unacceptably high manufacturing cost and high costs for casting and machining individual airfoils and bonding the individual airfoils into a bladed ring or nozzle.

A nickel based superalloy, or high-performance alloy, is an alloy that exhibits several key characteristics: excellent mechanical strength, resistance to thermal creep deformation, good surface stability, and resistance to corrosion or oxidation. The crystal structure is typically face-centered cubic austenitic. Examples of such alloys are Hastelloy, Inconel, Waspaloy, Rene alloys, Incoloy, MP98T, TMS alloys, and CMSX single crystal alloys.

Dual alloy blisks composed of a cast equiaxed superalloy blade ring bonded to a high-strength disk alloy are also prior art. However, the cast equiaxed airfoils limit the temperature capability and performance of the turbine. Single crystal superalloy can maintain metal temperature capabilities at temperatures of up to 100 degrees F. or more above the maximum temperature ranges of equiaxed materials.

U.S. Pat. No. 6,969,240 issued to Strangman on Nov. 29, 2005 discloses a lightweight high temperature bladed turbine disk intended for use in gas turbine engines. The bladed disk comprises a cast integral ring of single crystal airfoils with the primary and secondary crystallographic orientation being the same for each airfoil. Low-angle mismatch boundaries are present in the endwalls that couple adjacent airfoils. The cast ring of single crystal turbine blades is diffusion bonded to a high strength equiaxed disk. The resulting single crystal bladed disk is endowed superior performance, temperature capability, and lower weight and cost, relative to conventional turbines composed of individually cast single crystal blades, which are mechanically inserted into machined slots in the disk, or lower strength cast equiaxed blade rings that are diffusion bonded to a high strength turbine disk.

BRIEF SUMMARY OF THE INVENTION

An apparatus and a process for making an air cooled integrally bladed rotor turbine for a gas turbine engine in which a high strength nickel disk is formed around single crystal rotor blades with cooling air passages, and where the central bore of the disk includes cooling air inlets to supply cooling air through the disk to the cooling air passages within the rotor blades.

The air cooled IBR is formed using a multiple piece mold with reusable Molybdenum tooling and expendable molybdenum tooling with IN100 metal powder solidified using high isostatic pressure (HIP) or high pressure super-plasticity. The expendable molybdenum tooling is removed using sublimation from oxygen in air at an elevated temperature of around 1,300 degrees F.

The cast IBR can be machine finished on the rotor surfaces, and then stress relieved using heat treatment.

DETAILED DESCRIPTION OF THE INVENTION

The present invention is an air cooled turbine integrally bladed rotor for a gas turbine in which the rotor blades are single crystal material cast into a high strength nickel alloy disk using reusable and expendable molybdenum tooling. Single crystal turbine rotor blades have higher temperature resistance and better creep resistance than typical nickel superalloy blades that are not single crystal. The rotor disk can still be made of high strength nickel equiax alloy material due to the superior fatigue capability of this material.

Figure 1:
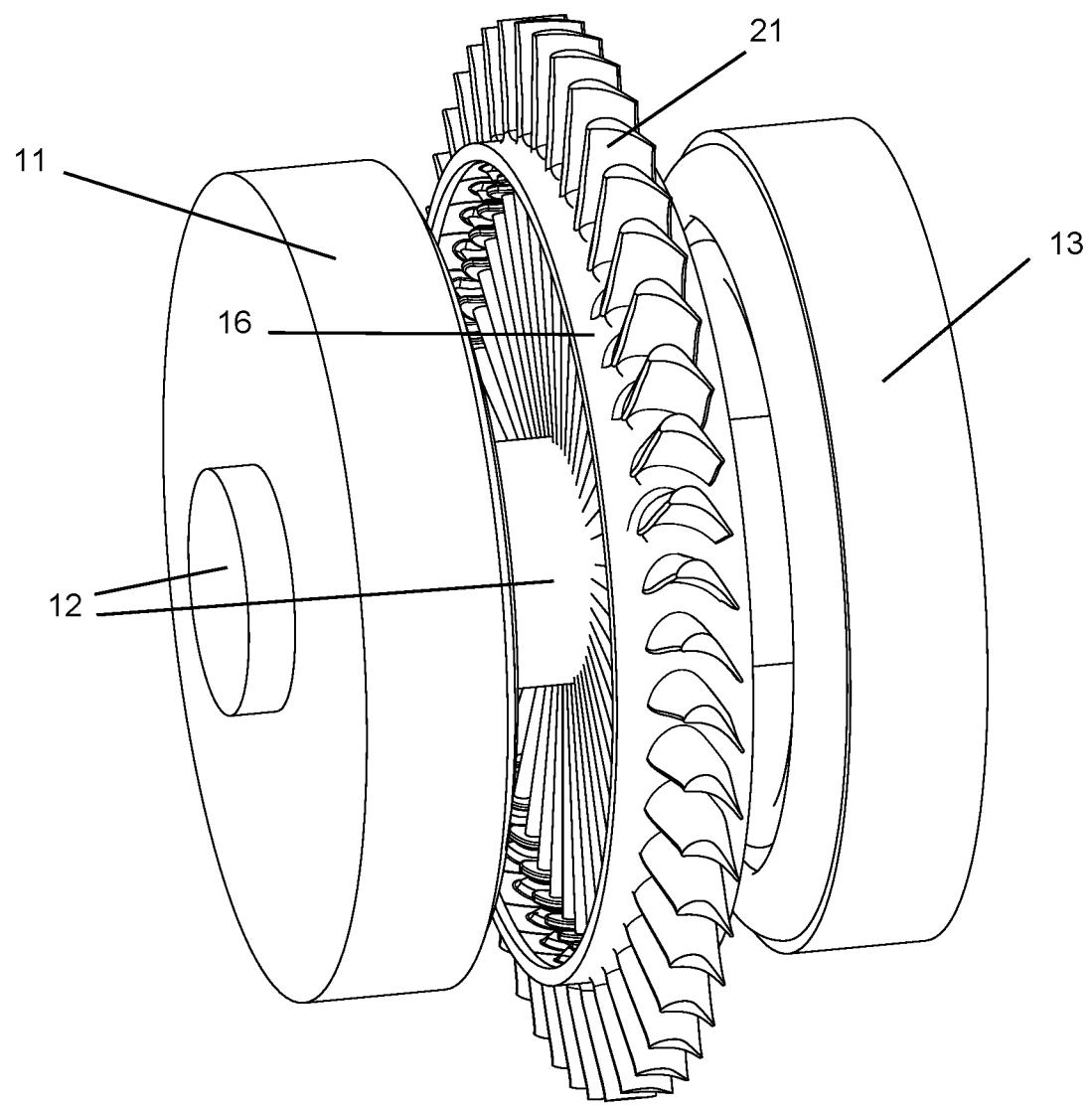
FIG. 1 shows a view of a part of the mold used to form the cooled IBR with the reusable molybdenum tooling of the present invention.

FIG. 1 shows part of the tooling used to form the IBR and includes a forward die 11 and an aftward die 13 with an inner cylindrical shaped center die or hub 12. A number of single crystal turbine rotor blades 21 extend outward from an annular blade ring tool 16. The forward die 13 and the aftward die 13 and the inner center hub 12 are made of Molybdenum and are all reusable tooling.

Figure 2:
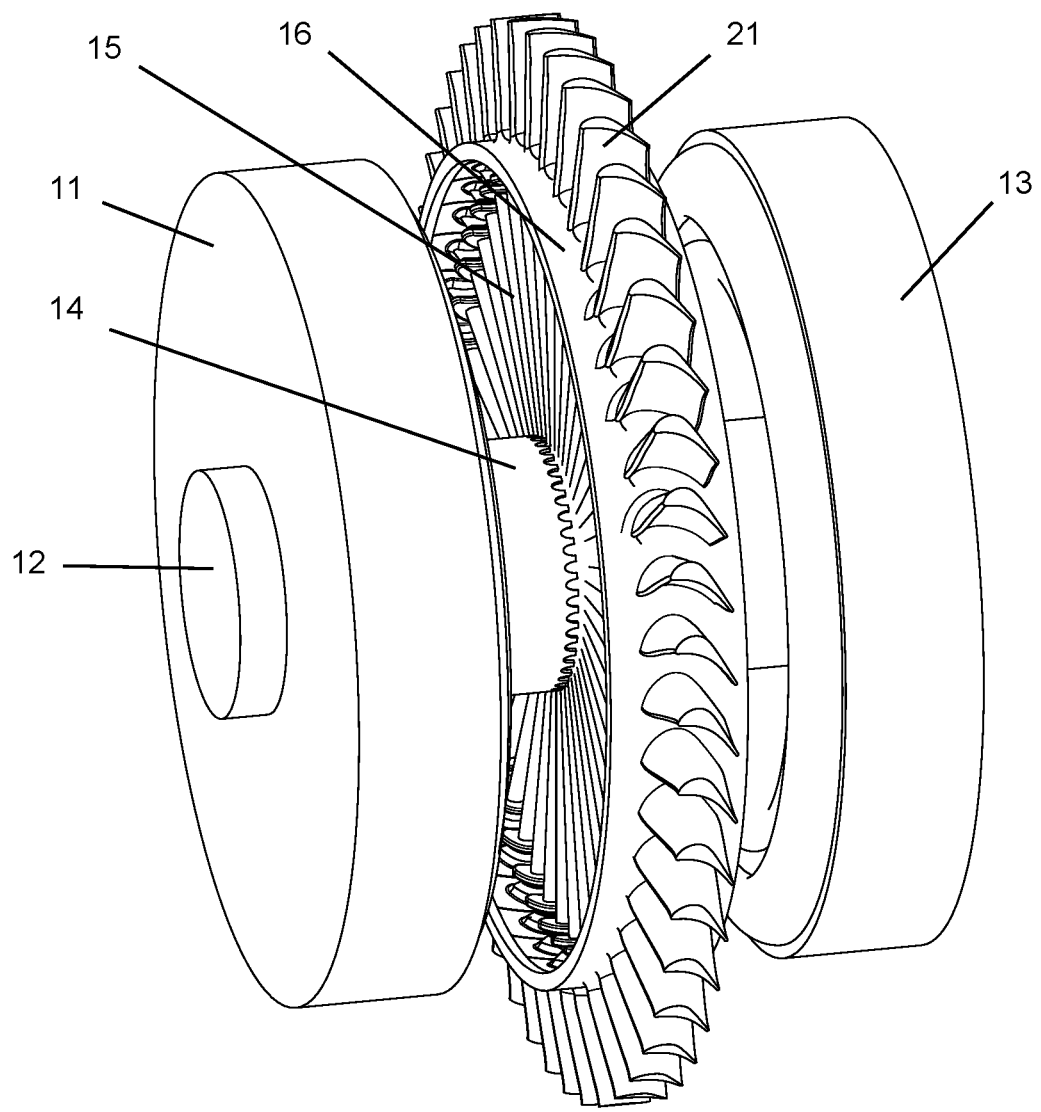
FIG. 2 shows a part of the mold used to form the cooled IBR with the expendable molybdenum tooling of the present invention.

FIG. 2 shows the forward die 11 and the aft die 13 with a forward outer center die 14 located over the inner center die 12 in FIG. 1. The single crystal rotor blades 21 extend outward from the annular blade ring tool 16. Each rotor blade 21 is connected to a molybdenum cooling supply tubular tools or toolings 15. The tubular tools 15 have a size to form the radial cooling air supply channels through the disk and into the blades. An aft outer center die (17 in FIG. 3) is also used but not shown in FIG. 2. The forward and aft outer center dies 14 both have half circular shaped sides in which the cooling air supply tubular tool forming dies 15 are pinched to locate and secure within the tooling.

Figure 3:
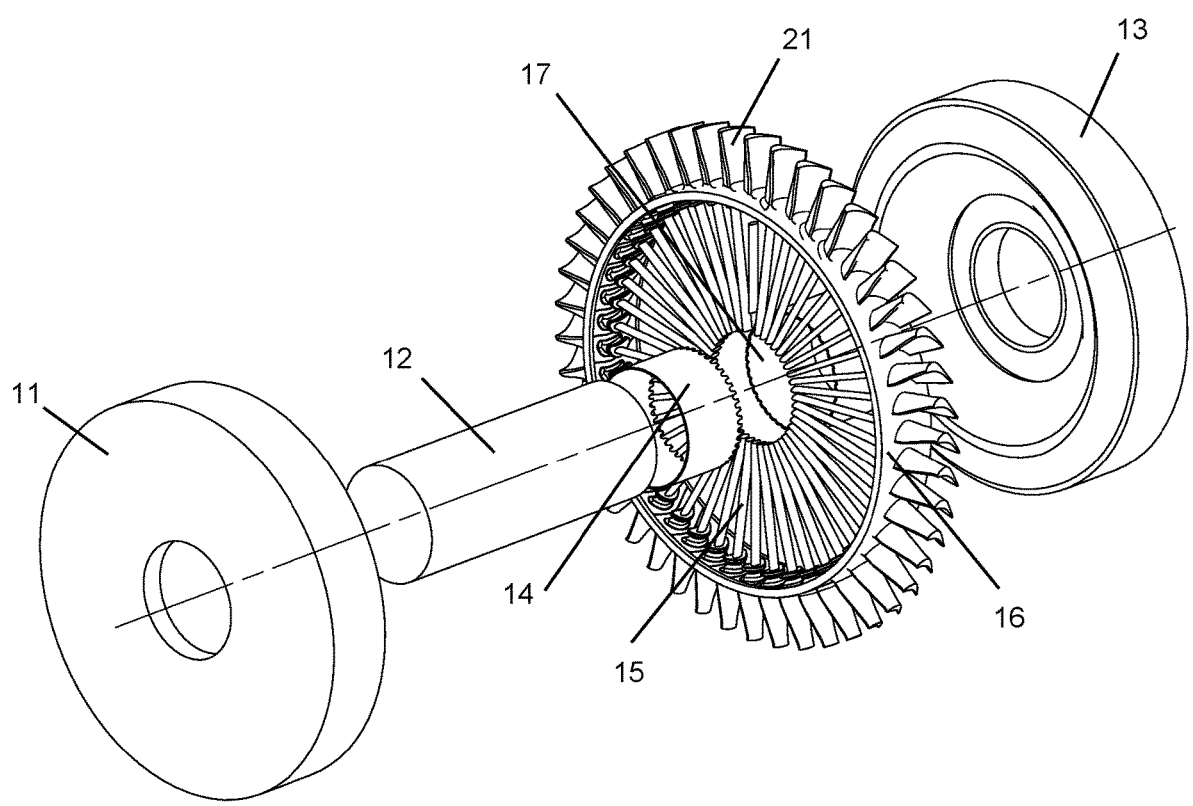
FIG. 3 shows the parts of the mold used to form the cooled IBR of the present invention.

FIG. 3 shows an exploded view of the tooling used to form the IBR of the present invention. The forward die 11 and the aft die 13 and the inner center hub 12 form the disk and central bore of the IBR. The forward outer center die 14 and the aft outer center die 17 secure the cooling air supply tubular tools 15 within the tooling. The tubular tools 15 extend into the cooling air supply inlets for each of the rotor blades 21. Use of these Molybdenum coolant passage forming tubular tubes 15 allow for the cooling air passages to be easily formed with the disk and also for easy removal from the cast IBR using heated air.

Figure 4:
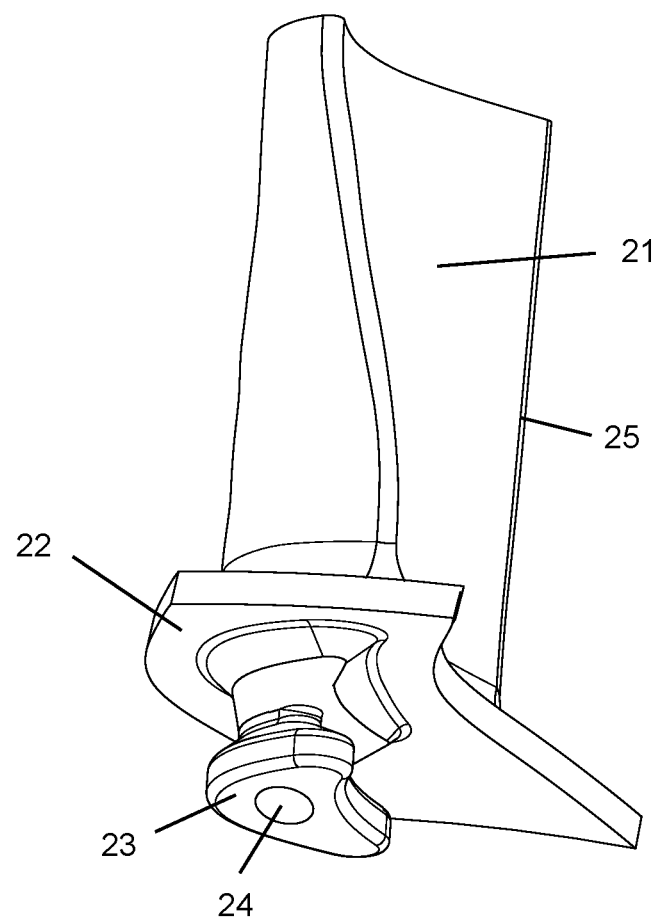
FIG. 4 shows a view of one of the single crystal air cooled turbine rotor blades used to form the cooled IBR of the present invention.

FIG. 4 shows details of each of the single crystal turbine rotor blades 21. Each rotor blade 21 is cast from a nickel superalloy as a single crystal material for strength and high temperature resistance. Each rotor blade 21 is cast with internal cooling circuit that can include film cooling holes and cooling air discharge slots. Each rotor blade 21 includes a platform 22 and an attachment which in this embodiment is cast with a single tooth curved root fir tree. A curved root provides for better short neck load transition from the airfoil into the load bearing surface which transitions the blade load to the disk. The load transfer mechanism is like a conventional single tooth fir tree except curved with the same contour as the root of the airfoil. A blade coolant feed hole 24 is located on a bottom side of the attachment and has a gradual taper like that of a Morse taper in order to trap the Molybdenum coolant tube 15 which transitions to the disk.

Figure 5:
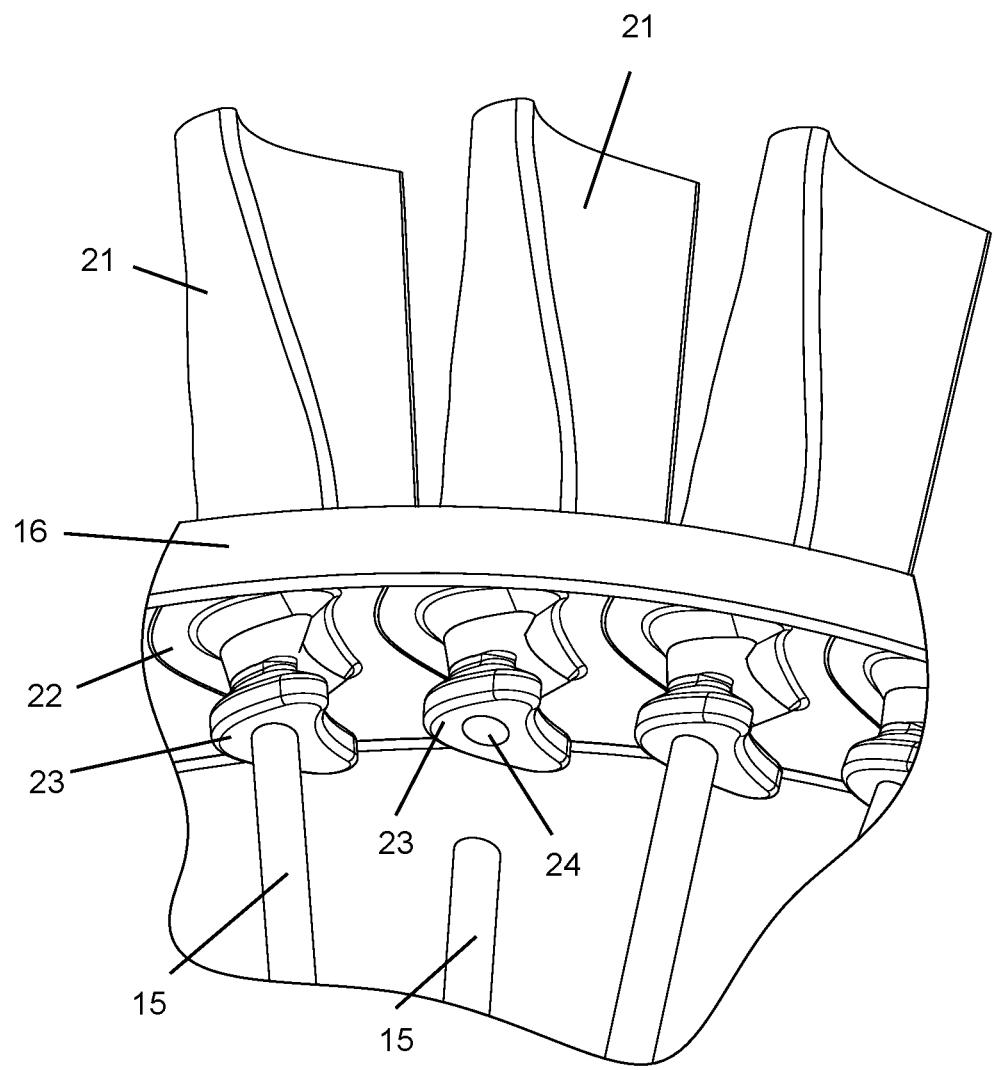
FIG. 5 shows a view of a section of an annular ring used in the mold to position the single crystal rotor blades in the mold to form the outside diameter of the rim of the cooled IBR of the present invention.

FIG. 5 shows a section of the annular blade ring tool 16 which has openings in which the rotor blades 21 are inserted into radially from the inside. The blade ring tool openings are shaped like the airfoils. The platforms 22 of the blades 21 abut an underside of the blade ring tool 16 to position each blade 21 within the tooling and the inside of the platform 22 will form the outer extremity of the disk. Each hole 24 in the attachment 23 connects to a coolant tubular tools 15. With all of the rotor blades 21 secured in the openings of the blade ring tool 16 and the coolant tubular tools 15 secured in the attachment openings 24 on one end and the half circular ends of the outer center hubs 14 and 17 on the opposite end and the forward die 11 and the aft die 13 closed to form the mold assembly, the mold assembly is then filled with metal powder to form the IBR.

Figure 6:
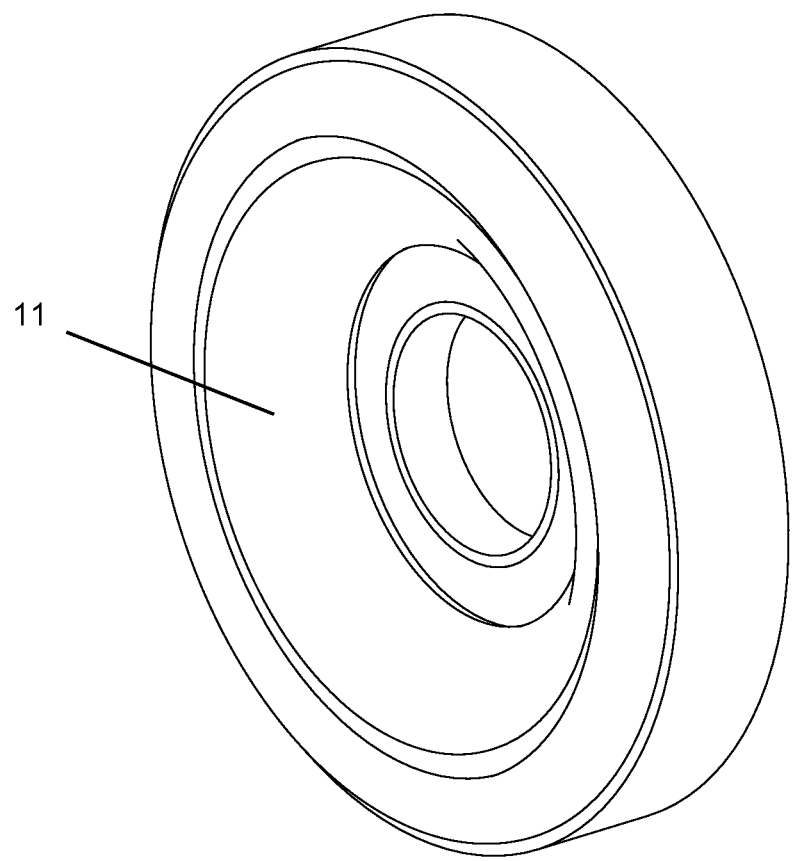
FIG. 6 shows the aft side mold with the near net shape of the final rotor used to form the cooled IBR of the present invention.
Figure 7:
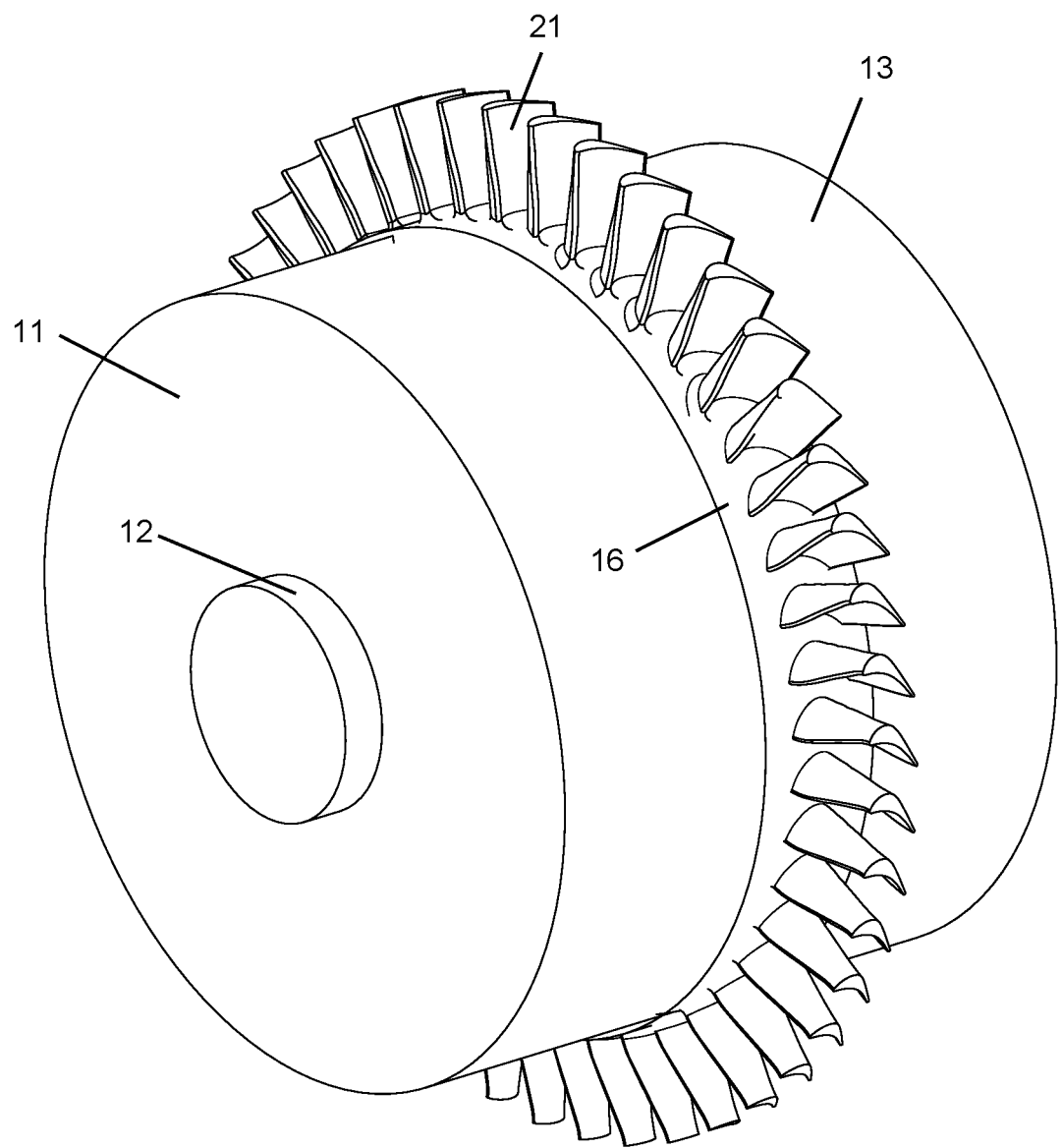
FIG. 7 shows the mold with the rotor blades used to form the cooled IBR of the present invention.
Figure 8:
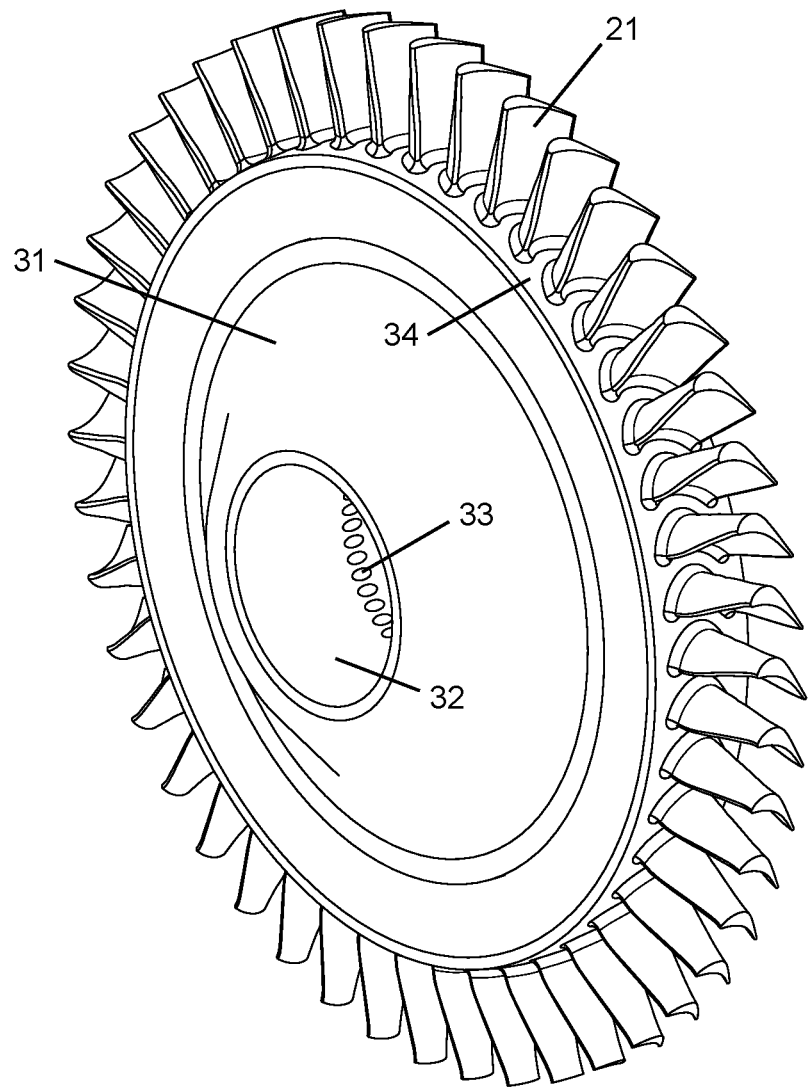
FIG. 8 shows the cooled IBR with rotor blades of the present invention.

FIG. 6 shows the forward die 11 with a bore opening and the surface which forms a forward side of the IBR. FIG. 7 shows the forward die 11 and the aft die 13 with the inner center hub 12 in place and the rotor blades 21 extending outward from the annular blade ring tool 16. The mold assembly in FIG. 7 is filled with metal powder that is used to form the IBR. In this embodiment, the metal powder is IN100 and a HIP process or a high pressure super plasticity process is used to form the IBR with the reusable and expendable tooling. After the metal powder has been solidified, the reusable molybdenum tooling is removed and the IBR with single crystal rotor blades embedded within the disk is exposed to oxygen at elevated temperature to sublimate the expendable molybdenum tooling. The forward and aft outer center dies 14 and 17 are sublimated away when exposed to oxygen. Also, the coolant tubular tools 15 and the annular blade ring 16 are also removed by sublimation when exposed to oxygen. A finished air cooled IBR having single crystal rotor blades embedded within a nickel disk is shown in FIG. 8. The disk 31 is formed with the forward and aft sides and an axial bore 32 with cooling air supply holes 33 opening within the axial bore 32. The rotor blades 21 extend from a disk rim 34 that is formed by the annular blade ring tool during the IBR forming process.

Some benefits of the cooled IBR of the present invention are listed below. The rotor blades are cast single crystal blades with internal cooling passages. Each blade uses a single tooth curved root blade attachment. The rim of the disk is contiguous and thus not subject to parasitic coolant air leakage.

The rotor disk is IN100 powder solidified using a HIP process with reusable and expendable tooling. The solidified IBR with the molybdenum expendable tooling is exposed to an elevated temperature in air of around 1,300 degrees F. to sublimate the Molybdenum cores and remaining tooling. The IBR can be finished with machining of the rotor surfaces, and then even stress relieved by heat treatment.

The forward and aft Molybdenum dies 11 and 13 are machined at the interface to represent a shape of the rotor surfaces before final machining. either the forward or aft Molybdenum dies 11 and 13 is installed with the bladed ring 16 and the bore hub 12 which has two thin molybdenum outer center hubs 14 and 17. These outer hubs 14 and 17 enter from the front and back and have semi-circular shaped ends that match a shape of the coolant tubular tools 15 to secure the coolant tubular tools 15 within the mold assembly. Metal powder is inserted into the resultant cavity and measures are taken to ensure a complete fill. If the outer hubs 14 and 17 bond to the inner hub 12, they are expendable when exposed to the air. However, a slip agent (such as a glass lubricant) can be applied in-between the inner hub 12 and the two outer hubs 14 and 17 to prevent bonding. Either a slip agent is applied at the interface of the nickel powder and the Molybdenum tooling, or a thin sacrificial Molybdenum foil can be placed in any interface to prevent bonding of the tool to the rotor during the formation.

With all tooling in place, the assembly is then preheated in a vacuum and then placed in a press to facilitate the consolidation of the metal powder by applying pressure to the forward die 11 and the aft die 13. The assembly is maintained at the elevated temperature (around 2,160 degrees F.) sufficient to super plastically flow the metal powder and ensure that there are no voids or unconsolidated powder. Once sufficient time has elapsed in a vacuum (around 3 hours) to ensure complete formation, the assembly is withdrawn from the press and allowed to cool. The reusable Molybdenum tooling is removed and the IBR is heated to around 1,300 degrees F. in air to allow the remaining Molybdenum tooling to sublimate and disappear.

The process of consolidation of the metal powder should yield a near-net shape of the IBR. However, some final machining might be required such as for skin cuts for cleanup of surfaced. Then, a final stress relief heat treatment can be performed.

The resulting IBR with single crystal turbine rotor blades with cooling embedded within a Nickel disk can be used in a flow path temperature exceeding 2,400 degrees F. in a small gas turbine engine.

The invention claimed is:

1. A process of forming an air cooled integrated bladed rotor disk having single crystal material rotor blades and an equiax rotor disk comprising the steps of:
    forming a plurality of single crystal turbine rotor blades, each of the plurality of single crystal turbine rotor blades having an airfoil section extending from an attachment section with an internal cooling air passage having an inlet;
    forming an annular blade ring tool having a plurality of openings;
    inserting the plurality of single crystal turbine rotor blades into the plurality of openings in the annular blade ring tool;
    inserting a different one of a plurality of tubular tools into the inlet of each of the plurality of single crystal turbine rotor blades;
    placing the annular blade ring tool with the plurality of single crystal turbine rotor blades and the plurality of tubular tools within a mold;
    filling the mold with a metal powder material; and,
    compressing the metal powder material within the mold to form an equiax rotor disk with the plurality of single crystal turbine rotor blades embedded within the equiax rotor disk.

2. The process of forming an air cooled integrated rotor disk of claim 1, further comprising the step of forming the plurality of tubular tools of a material that can be removed by sublimation when exposed to oxygen; and
    the forming of the annular blade ring tool including forming the annular blade ring tool of the material that can be removed by sublimation when exposed to oxygen.

3. The process of forming an air cooled integrated rotor disk of claim 2,
    wherein the material used to form the annular blade ring tool and the plurality of tubular tools is Molybdenum.

4. The process of forming an air cooled integrated rotor disk of claim 1,
    wherein the forming of the plurality of single crystal turbine rotor blades includes forming each of the plurality of single crystal turbine rotor blades with a platform having a bottom side, the bottom side of the platforms forming an outer radius of the rotor disk.

5. The process of forming an air cooled integrated rotor disk of claim 1, further comprising the step of:
    securing a bottom end of each of the plurality of tubular tools with the mold using two circular shaped dies that engage with the plurality of tubular tools to secure the plurality of tubular tools in place.

6. The process of forming an air cooled integrated rotor disk of claim 1, and further comprising the steps of:
    forming the mold with a forward die and an aft die and a center die in which the forward die forms a forward side of the rotor disk and the aft die forms an aft side of the rotor disk and the center die forms a central axial bore of the rotor disk; and,
    the forward die and the aft die and the center die are formed of a Molybdenum material that is reused to form additional air cooled integrated bladed rotor disks.

7. The process of forming an air cooled integrated rotor disk of claim 1, further comprising the step of:
    using a slip agent on the annular blade ring tool and the plurality of tubular tools to prevent bonding of the rotor disk with the annular blade ring tool and the plurality of tubular tools.

8. The process of forming an air cooled integrated rotor disk of claim 1, and further comprising the step of:
    forming each attachment section as a single curved root attachment.

9. The process of forming an air cooled integrated rotor disk of claim 6, and further comprising the step of:
    forming an axial center opening in the forward die and the aft die to fit the center die and secure the center die within the mold.

* * * * *